United States Patent [19]

Ogawa et al.

[11] Patent Number: 4,805,000
[45] Date of Patent: Feb. 14, 1989

[54] EXPOSURE APPARATUS

[75] Inventors: Kazufumi Ogawa; Masaru Sasago, both of Hirakata; Masayuki Endo, Izumi; Takeshi Ishihara, Neyagawa, all of Japan

[73] Assignee: Matsushita Electric Industrial Co., Ltd., Osaka, Japan

[21] Appl. No.: 104,041

[22] Filed: Oct. 2, 1987

Related U.S. Application Data

[63] Continuation-in-part of Ser. No. 4,133, Jan. 16, 1987, Pat. No. 4,724,466.

[30] Foreign Application Priority Data

Jan. 17, 1986 [JP] Japan ............................... 61-8226
Jan. 17, 1986 [JP] Japan ............................... 61-8227
Jan. 17, 1986 [JP] Japan ............................... 61-8228
Mar. 27, 1987 [JP] Japan ............................... 62-74616

[51] Int. Cl.⁴ .................. G03B 27/42; G03B 27/52; G03B 27/70
[52] U.S. Cl. ..................................... 355/43; 355/53
[58] Field of Search ............... 355/30, 43, 45, 53, 355/68, 67; 356/401

[56] References Cited

U.S. PATENT DOCUMENTS

| | | | |
|---|---|---|---|
| 4,561,773 | 12/1985 | Sato | 355/43 |
| 4,595,282 | 6/1986 | Takahashi | 355/53 |
| 4,653,903 | 3/1987 | Torigoe et al. | 355/53 |
| 4,667,109 | 5/1987 | Kano | 356/401 X |
| 4,711,568 | 12/1987 | Torigoe et al. | 355/68 |
| 4,724,466 | 2/1988 | Ogawa et al. | 355/53 |

*Primary Examiner*—Richard A. Wintercorn
*Attorney, Agent, or Firm*—Wenderoth, Lind & Ponack

[57] ABSTRACT

An exposure apparatus for use in manufacturing a semiconductor device which includes a KrF laser as an Excimer laser, a reduction projective type exposure optical system for applying laser beam emitted the laser on a wafer, and a support with vibration absorption function on which the KrF laser is mounted separately from the exposure optical system. The light axis of a light path between the KrF laser and the exposure optical system coincides with direction of vibration which is absorbed in the support.

Thereby, shock wave produced from KrF laser upon discharge operation may be absorbed in said support without giving any bad effect to other components.

5 Claims, 5 Drawing Sheets

EXPOSURE APPARATUS

This application is a continuation-in-part of application Ser. No. 4,133, filed Jan. 16, 1987 now U.S. Pat. No. 4,724,466 issued Feb. 9, 1988.

BACKGROUND OF THE INVENTION

This invention relates to an exposure apparatus, and more particularly to a reduction projective type Excimer exposure apparatus which is capable of realizing super fine processing in photolithography processes for use in fabrication of semiconductor devices.

In the past, commercially available reduction projective type exposure apparatus (stepper) was of the structure in which super high pressure mercury lamp is used as light source for fine processing of semiconductor devices, in particular LSI, VLSI. However, since such conventional stepper uses g-line (436 nm), i-line (365 nm) of super high pressure mercury lamp, its resolution has some limitations; approximately 1.2 $\mu$m for g-line and approximately 0.8 $\mu$m for i-line.

To overcome such limitations, recently some developments have been moved forward. In such development, Excimer light source, e.g., XeCl (308 nm), KrF (249 nm), ArF (193 nm) whose wavelength is shorter than that of g-line, i-line.

However, since Excimer light source makes use of a high voltage pulse discharge, vibration occurs due to shock wave upon oscillation and it gives bad effects to alignment and exposure operation. Further, it is necessary to provide large space for installing the light source, which gives bad effects to manufacturing semiconductor devices wherein expensive super clean room is required.

As to the problem of vibration, we can get some extent of solution by mounting all elements such as a light source, lens system, wafer stage, mask holder on the same base with vibration protection structure, but in such case, installation space for the exposure apparatus becomes three times larger than that in conventional way.

SUMMARY OF THE INVENTION

This invention, therefore, has as its principal object the provision of an exposure apparatus which is free from the problem of vibration and at the same time does not require a large space for installation.

Another major object of this invention is to provide an exposure apparatus having TTL alignment system by use of a beam splitter of special structure or another means.

These and other objects are accomplished according to the present invention by an exposure apparatus which comprises an Excimer light source, an exposure optical system for applying light emitted from the Excimer light source on a semiconductor substrate, and a support with vibration absorption function on which the Excimer light source is mounted and the exposure optical system is not mounted. The light axis of a light path between the Excimer light source and the exposure optical system coincides with direction of vibration which is absorbed in the support.

In a particular embodiment, the Excimer light source includes an Excimer laser which is one of KrF laser, XeCl laser and ArF laser. The exposure optical system includes a mask holder, a reduction projective lens, and a wafer holder. The support includes a support plate on which the Excimer laser is mounted and legs which are disposed on bottom surface of the support plate and in which air suspensions are disposed for absorbing the vibration. The light axis and direction of the vibration are vertical direction. The Excimer light source includes an Excimer laser mounted horizontally and a first mirror for reflecting the laser beam emitted from the Excimer laser, and the exposure optical system includes a second mirror for reflecting the laser beam reflected by the first mirror, and the light path is a light path between the first and second mirrors.

In another particular embodiment, the Excimer light source includes an Excimer laser mounted vertically, and the exposure optical system includes a mirror for reflecting the laser beam emitted from the Excimer laser, and the light path is a light path between the Excimer laser and mirror.

This invention also relates to an exposure apparatus which comprises an Excimer laser, an exposure optical system for applying laser beam emitted from the laser on a semiconductor substrate through a mask, an alignment optical system for making alignment of the mask and semiconductor substrate including an alignment light source, wavelength of alignment light emitted from the alignment light source being different from that of the laser beam, and a beam splitter disposed in the exposure optical system through which splitter both the beam and the alignment light pass, the beam splitter including two elements which are fixed with each other by use of adhesive which has such a characteristic that both the laser beam and the alignment light pass therethrough.

This invention further relates to an exposure apparatus which comprises an Excimer laser, an exposure optical system for applying laser beam emitted from the laser on a semiconductor substrate through a mask, an alignment optical system for controlling alignment of the mask and semiconductor susbstrate including an alignment light source, wavelength of alignment light emitted from the alignment light source being substantially the same as that of the laser beam, a beam splitter disposed in the exposure optical system through which splitter both the laser beam and the alignment light pass, the alignment optical system including first means for converting wavelength of alignment light to visible one, and second means for converting the visible light to electric signal, and alignment driving means responsive to the electric signal for making alignment of the mask and semiconductor substrate.

According to the present invention as described herein, the following benefits, among others, are obtained.

(1) Since an Excimer light source portion is separated from other components and mounted on a base which has vibration absorption structure, vibration due to the oscillation of the Excimer light source is never transferred to the other components for an exposure apparatus.

(2) Since the vibration direction of the base which has vibration absorption structure coincides with the light axis of optical system including the Excimer light source, coupling mirrors, aberration between a light axis at the Excimer light source portion and a light axis at other components portion does not occur. In this case, aberration of length of light paths occurs, but it has nothing to do with pattern resolution.

(3) Further, as a result of separation structure of an Excimer light source and other components, space for installing an exposure apparatus may be reduced in a super clean room.

(4) Further, by use of a beam splitter through which both exposure light and alignment light pass, an exposure apparatus with TTL alignment system may be realized.

(5) Still further, by use of first means for converting wavelength of alignment light to visible one and second means for converting the visible light to electric signal for alignment driving use, an exposure apparatus with TTL alignment system may be realized.

While the novel features of the invention are set forth in the appended claims, the invention both as to organization and content, will be better understood and appreciated, along with other objects and features thereof, from the following detailed description taken in conjunction with the drawings.

DETAILED DESCRIPTION OF THE INVENTION

Figure 1:
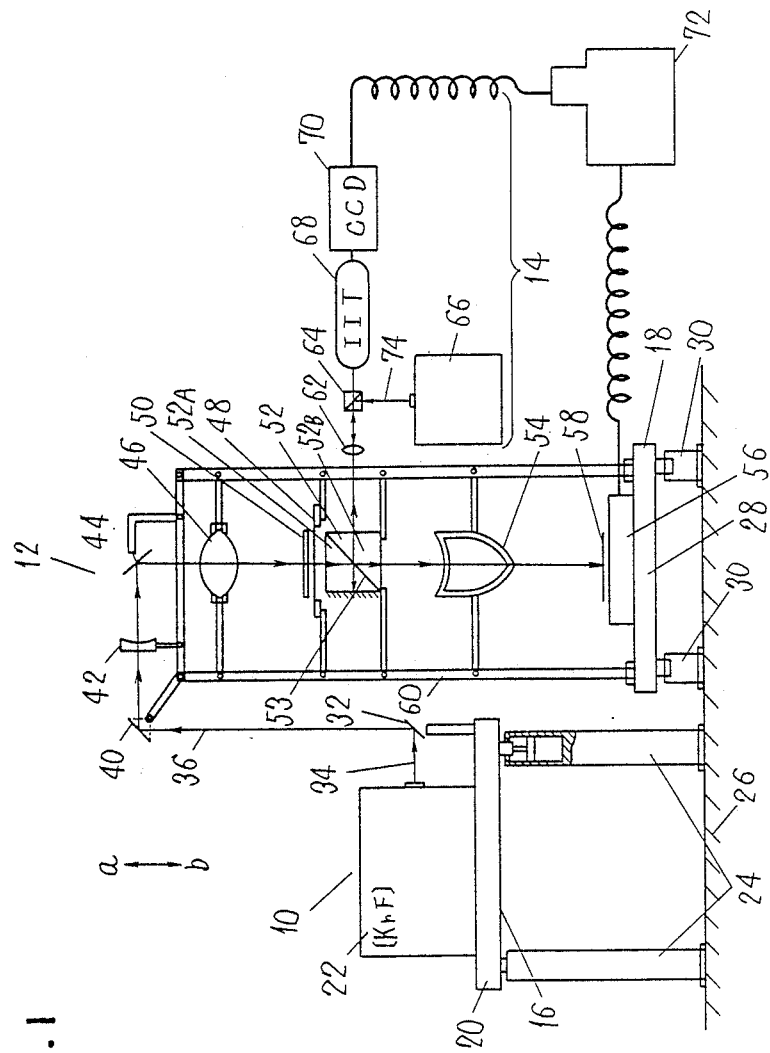
FIG. 1 shows schematic structure of an exposure apparatus as first embodiment according to the invention.

FIG. 1 shows schematic structure of an exposure apparatus. The exposure apparatus comprises, roughly speaking, three major elements, i.e., (i) Excimer light source 10, (ii) exposure optical system 12, and (iii) alignment optical system 14. Among these three elements, Excimer light source 10 is mounted on first support 16. Other elements, i.e., exposure optical system 12 and alignment optical system 14 are mounted on second support 18. These first and second supports 16, 18 have vibration protection structure. That is, for example, as to first support 16, it comprises support plate 20 on which Excimer laser, in this embodiment KrF laser 22 is mounted, and four legs 24. Each of legs 24 includes air suspension therein, and therefore, shock wave (mainly a-b direction movement) due to oscillation (discharge operation) of KrF laser 22 is absorbed by a-b direction (vertical) movement of the air suspensions or air cylinders in legs 24 and is not transferred to floor 26. The movement of a-b direction may be approximately 1 mm at most. A movement of direction perpendicular to a-b direction may be less than 0.1 mm, if any. Second support 18 comprises support plate 28 and four legs 30 with air suspensions. Any vibrations on floor 26 can be absorbed by the air suspensions and therefore, are not transferred to exposure optical system 12 and alignment optical system 14. That is, these systems are free from any external vibration. These supports 16, 18 are commercially available and for example, manufactured by Shows Cable and Wire Co. in Japan.

Excimer light source 10 comprises KrF laser 10 and first mirror 32 which is used for changing the direction of laser beam 34 emitted from KrF laser 10 to a-b direction, i.e., vertical direction. In other words, light axis of beam 36 coincide with the movement of air suspensions in legs 24, i.e., a-b direction movement. The first mirror 32 is mounted on support plate 20 through member 38.

The exposure optical system 12 comprises second mirror 40, integrator 42, third mirror 44, condenser lens 46, mask holder 48 which holds mask 50 or reticle, beam splitter 52, reduction projective quartz lens 54 and wafer stage 56 on which a semiconductor substrate or wafer 58 is mounted. These members are mounted on frame structure 60. The laser beam 36 is vented by second mirror 40, then passes through integrator 42, then is further vented by third mirror 44, and then is applied to wafer 58 through condenser lens 46, mask 50, beam splitter 52, and reduction projective lens 54.

The alignment optical system 14 comprises alignment lens 62, alignment beam splitter 64, alignment light source 66 (e.g., light of super high pressure mercury lamp is divided by a cut filter or monochromater and such divided light is used as alignment light source 66), image intensifier tube (IIT) 68 for amplifying image pattern signals, and charge coupled device (CCD) camera 70 for reading an image. The output of CCD camera 70 is applied to computer 72 in which alignment processing (i.e., alignment of mask 50 and wafer 58) is carried out. Then, computer 72 supplies alignment control signals to wafer stage 56. This stage 56 is an X-Y-Z table and therefore a position of wafer 58 is adjusted according to the alignment control signal so that mask 50 is aligned with wafer 58. The computer 72 is mounted separately from frame structure 60 in this embodiment, but may be mounted on the structure 60.

As explained above, Excimer KrF laser 22 is separated from other elements. Shock wave of laser 22 is absorbed by vertical movement (a-b direction) of first support 16, in particular, air suspensions in legs 24. The light axis of laser beam 36 coincides with the movement direction. Therefore, strong shock wave of laser 22 does not give any bad effect to any other elements so that high resolution (e.g., 0.5 $\mu$m which is necessary for manufacturing super VLSI) type exposure apparatus may be realized.

Figure 2:
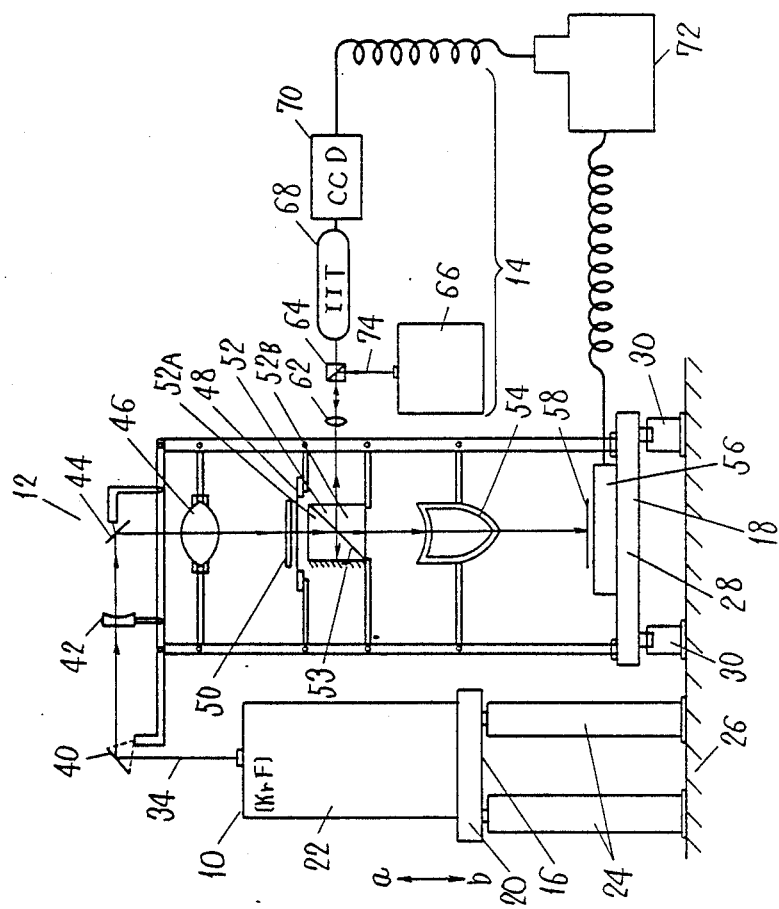
FIG. 2 shows modification of FIG. 1 structure as second embodiment.

Incidentally, in the above embodiment, first mirror 32 is used for venting the laser beam 34 so that light axis of the beam coincides with vibration movement direction (a-b direction). However, if laser 22 is mounted vertically as shown in FIG. 2, it is not necessary to provide first mirror 32 so that the structure becomes simpler.

In the above embodiments, the alignment is conducted by TTL (Through The Lens) system in which beam splitter 52 is used. The assembling of beam splitter 52 requires adhesive. The wavelength of alignment light and that of exposure laser beam are different from each other. Therefore, the beam splitter 52 is required to pass light of at least two ranges of wavelength. However, such beam splitter has not yet developed since appropriate adhesive, which passes through at least two wavelength ranges, has not yet been found.

The beam splitter 52 in the embodiments can pass light of two wavelengths therethrough.

Figure 3:
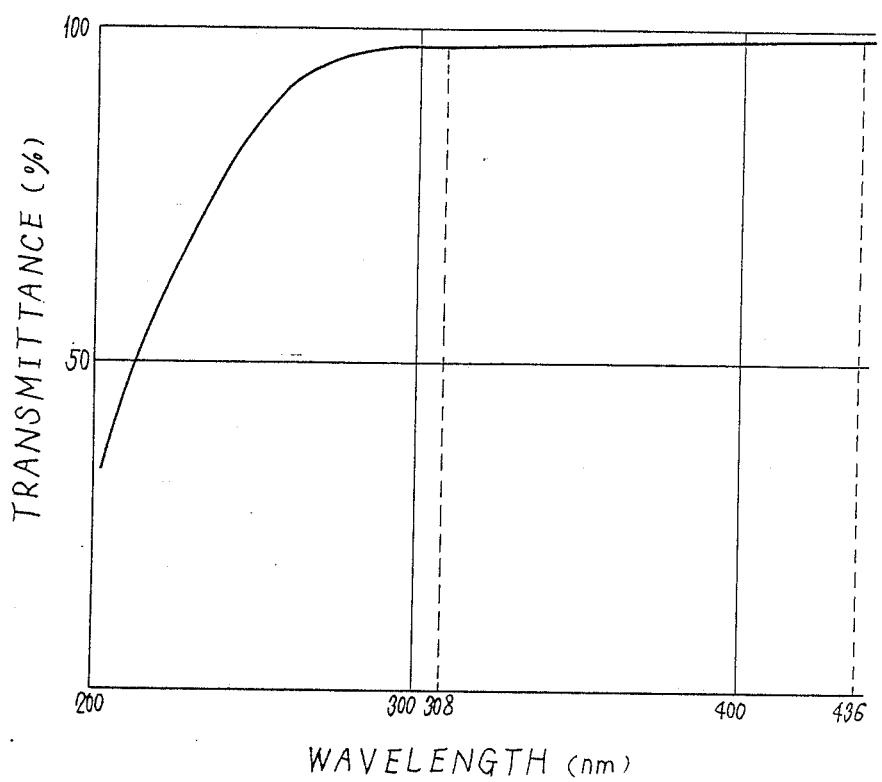
FIGS. 3, 4 and 5 show characteristics of transmittance of adhesive which is used for a beam splitter in FIG. 1 structure.

As a first example, XeCl (308 nm) Excimer laser beam is used as exposure light and g-line (436 nm) of super high pressure mercury lamp is used as alignment light. In this case, synthetic quartz is used as material of elements 52A, 52B of beam splitter 52 and epoxy type resin 53 (e.g., Epotec 305; mix curable type, U.S. Epoxy Technology Corporation's trade name) is used for connecting the elements 52A and 52B. Transmittance characteristic of adhesion using Epotec 305 is shown in FIG. 3. As is apparent from FIG. 3, the transmittance is almost 100% transparent from 280 nm to visible light range. Therefore, the beam splitter 52 can be used for both alignment light (436 nm) and exposure light (308 nm). Incidentally, photoresist which is used on wafer 58 in this case must be responsive to only wavelength of 308 nm.

Figure 4:
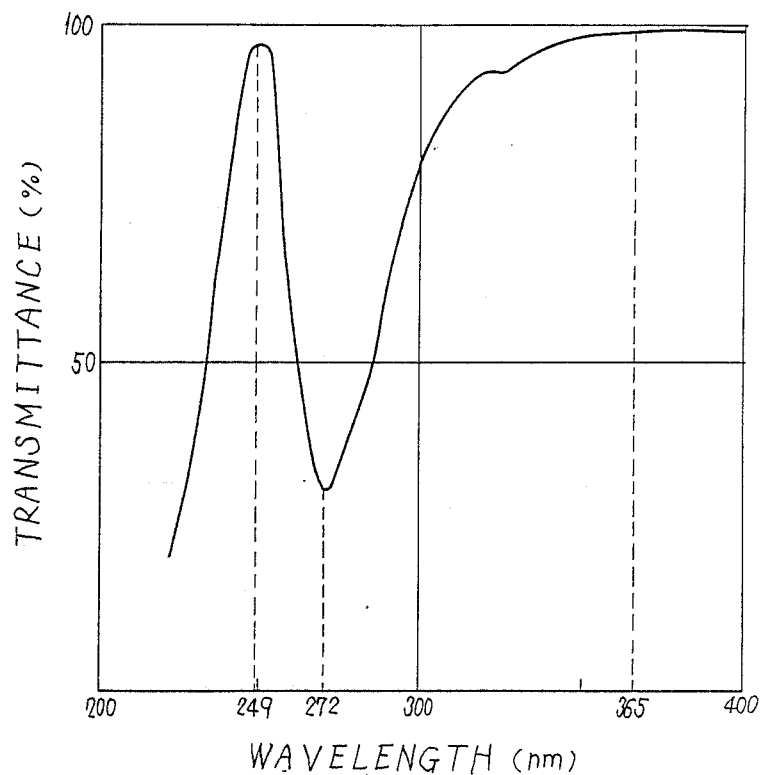

As a second example, KrF (249 nm) Excimer laser is used as exposure light, and i-line (365 nm) of super high pressure mercury lamp is used as alignment light. In this case, elements 52A, 52B are of synthetic quartz, and adhesive 53 is of acryl. polyester type (e.g., acrylate which has many responsible groups including —CH$_2$—OCOCH=CH$_2$ group) whose transmittance characteristic is shown in FIG. 4. FIG. 4 shows an absorption at 272 nm between 365 nm of alignment light and 249 nm of exposure light. However, at least at 365 nm and 249 nm, transmittance thereat is more than 98%. This means that the beam splitter is practically usable. In this case, photo-resist on wafer 58 must be responsive to only 365 nm light. The absorption at 272 nm may be effectively used as a filter of alignment light. Further, acryl. polyester type resin is featurized that it readily becomes photo-curable, heat-curable and has strong adhesiveness to quartz, glass material.

Figure 5:
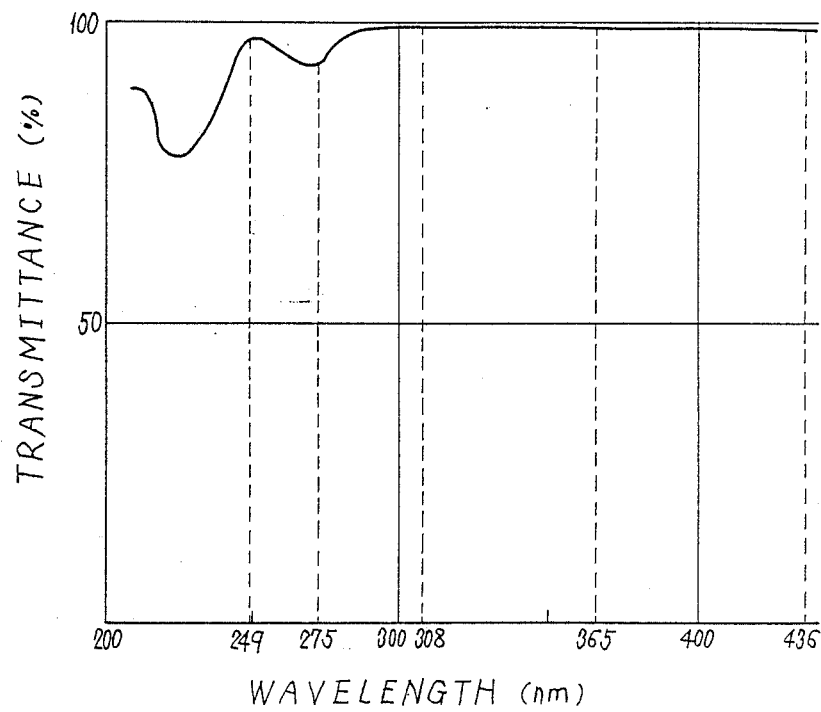

As a third example, XeCl (308 nm) Excimer laser beam is used as exposure light and g-line (436 nm) of super high pressure mercury lamp is used as alignment light. In this case, synthetic quartz is used as material of elements 52A, 52B of beam splitter 52 and polyvinyl butylarl (Eslex B, Sekisui Chemical's trade name) 53 is used for connecting the elements 52A and 52B. Transmittance characteristic of adhesion using Eslex B is shown in FIG. 5. As is apparent from FIG. 5, the transmittance is almost 98% transparent from 300 nm to visible light range. Therefore, the beam splitter 52 can be used for both alignment light (436 nm) and exposure light (308 nm). Incidentally, photo-resist which is used on wafer 58 in this case must be responsive to only wavelength of 308 nm.

As a fourth example, KrF (249 nm) Excimer laser is used as exposure light, and i-line (365 nm) of super high pressure mercury lamp is used as alignment light. In this case, elements 52A 52B are of synthetic quartz, and adhesive 53 is of polyvinyl butylarl, whose transmittance characteristic is shown in FIG. 5. FIG. 5 shows an absorption at 275 nm between 365 nm of alightment light and 249 nm of exposure light. However, at least at 365 nm and 249 nm, transmittance thereat is more than 85%. This means that the beam splitter is practically usable. In this case, photo-resist on wafer 58 must be responsive to only 365 nm light. The absorption at 275 nm may be effectively used as a filter of alignment light. Further, polyvinyl butylarl type resin is featurized that it readily becomes photocurable, heat-curable and has strong adhesiveness to quartz, glass material.

In the above embodiment, super high pressure mercury lamp is used as alignment light source, but Xenone lamp, dueterium lamp, continuous oscillation type laser (e.g., HeCd laser) etc. may be used as alignment source.

As explained above, Excimer exposure apparatus with TTL alignment system is realized so that high alignment accuracy is accomplished as well as high resolution. In case of using KrF Excimer laser and i-line of super high pressure mercury lamp, resolution of 0.5 μm and alignment accuracy of ±0.05 μm are realized.

In the above embodiments, Excimer exposure apparatus with TTL alignment system is realized by use of beam splitter 52 which covers at least two wavelength ranges.

The following embodiment realizes Excimer exposure apparatus with TTL alignment system without using beam splitter 52 which covers two wavelength ranges. In this embodiment, it is all right that beam splitter 52 simply passes light of exposure beam wavelength (e.g., 249 nm in KrF Excimer laser). In this case, alignment light source 66 is designed to emit light of around 250 nm which is substantially the same as exposure beam wavelength by use of cut filter. The alignment light 74 is applied to alignment mark portion of wafer 58 through alignment beam splitter 64, alignment lens 62, beam splitter 52, and reduction projective lens 54. An image of an alignment mark of reticle or mask 50 is overlaid on the alignment mark on wafer 58. The image of these alignment marks at around 250 nm in ultraviolet range is returned to alignment optical system 14 and expanded by alignment lens 62. By use of this lens 62, very high resolution may be obtained. The image of ultraviolet range cannot be seen by the human eye and cannot be detected by a video camera. In the embodiment, IIT 68 is used to convert the wavelength of the image to visible wavelength range. The IIT 68 includes microchannel plate (MCP) for amplifying image signals to thereby improve S/N ratio. In this case, wavelength of the image is converted to more than 500 nm, visible range, and therefore CCD camera 70 detects the image pattern. The IIT 68 has Cs-Te opto-electroconversion surface and is sensitive at 150–320 nm. In the embodiment, V1506 (model name manufactured by Hamamatsu Photonics Co. in Japan) is used as IIT 68, and F1217 (model name manufactured by Hamamatsu Photonics Co. in Japan) is used as MCP.

By disposing IIT 68 with MCP in front of CCD camera 70, the image of ultraviolet ray is converted to visible light and image amplification of approximately $10^4$ can be realized, so that high accuracy TTL system alignment is realized.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. An exposure apparatus comprising:
   an Excimer laser;
   an exposure optical system for applying emitted laser beam from said laser on a semiconductor substrate through a mask;
   an alignment optical system for making alignment of said mask and semiconductor substrate including an alignment light source, wavelength of alignment light emitted from said alignment light source being different from that of said laser beam; and
   a beam splitter disposed in said exposure optical system through which splitter both said laser beam and said alignment light pass, said beam splitter including two elements which are fixed with each other by use of polyvinyl butylarl which has such a characteristic that both said laser beam and said aligment light pass therethrough.

2. The exposure apparatus of claim 1, wherein said Excimer laser is a KrF laser.

3. The exposure apparatus of claim 1, wherein said alignment light source is one of super high pressure mercury lamp, Xenone lamp, duterium lamp and continuous oscillation type laser.

4. An exposure apparatus comprising:
   an Excimer laser;

an exposure optical system for applying a laser beam emitted from said laser on a semiconductor substrate through a mask;

an alignment optical system for controlling alignment of said mask and semiconductor substrate including an alignment light source, the wavelength of alignment light emitted from said alignment light source being substantially the same as that of said laser beam;

a beam splitter disposed in said exposure optical system through which splitter both said laser beam and said alignment light pass said beam splitter including two elements which are fixed with each other by use of polyvinylbutylarl which has a characteristic that both said laser beam and said alignment light pass therethrough;

said alignment optical system including first means for converting wavelength of alignment light to visible light to electric signal; and alignment driving means responsive to said electric signal for making alignment of the mask and semiconductor substrate.

5. The exposure apparatus of claim 4, wherein said first means includes an image intensifier and said second means includes a camera, and said alignment driving means includes X-Y table.

* * * * *